(12) United States Patent
Mieda et al.

(10) Patent No.: US 11,102,884 B2
(45) Date of Patent: Aug. 24, 2021

(54) OPTICAL MODULE

(71) Applicant: CIG Photonics Japan Limited, Kanagawa (JP)

(72) Inventors: Shigeru Mieda, Sagamihara (JP); Hirofumi Nakagawa, Kanagawa (JP); Daisuke Murakami, Akiruno (JP)

(73) Assignee: CIG PHOTONICS JAPAN LIMITED, Sagamihara (JP)

( * ) Notice: Subject to any disclaimer, the term of this patent is extended or adjusted under 35 U.S.C. 154(b) by 0 days.

(21) Appl. No.: 16/994,735

(22) Filed: Aug. 17, 2020

(65) Prior Publication Data

US 2021/0100097 A1 Apr. 1, 2021

(30) Foreign Application Priority Data

Sep. 26, 2019 (JP) .............................. JP2019-175610

(51) Int. Cl.
*H05K 1/11* (2006.01)
*H05K 7/14* (2006.01)
*H05K 1/14* (2006.01)

(52) U.S. Cl.
CPC ............. *H05K 1/113* (2013.01); *H05K 1/117* (2013.01); *H05K 1/144* (2013.01); *H05K 2201/041* (2013.01); *H05K 2201/2081* (2013.01)

(58) Field of Classification Search
USPC ....................................................... 361/790
See application file for complete search history.

(56) References Cited

U.S. PATENT DOCUMENTS

| 2016/0286657 A1* | 9/2016 | Ban | H05K 1/118 |
| 2019/0131284 A1* | 5/2019 | Jeng | H01L 21/486 |

FOREIGN PATENT DOCUMENTS

| JP | 06-53643 A | 2/1994 |
| JP | 07-283520 A | 10/1995 |

\* cited by examiner

*Primary Examiner* — Andargie M Aychillhum
(74) *Attorney, Agent, or Firm* — Mattingly & Malur, PC (57) ABSTRACT

An optical module includes: a first substrate with a first surface, the first substrate having some first pads on the first surface; a second substrate with a second surface, the second substrate having some second pads on the second surface, each of the first pads and a corresponding one of the second pads being opposed to each other and constituting an opposed pair of pads; a first insulation wall between an adjacent pair of the first pads, and in contact with the first surface of the first substrate; and a second insulation wall between an adjacent pair of the second pads, and in contact with the second surface of the second substrate. The first insulation wall and the second insulation wall overlap with none of the opposed pair of pads and are adjacent to each other in a direction along the first surface and the second surface.

7 Claims, 8 Drawing Sheets

OPTICAL MODULE

CROSS-REFERENCE TO RELATED APPLICATION

The present application claims priority from Japanese application JP2019-175610 filed on Sep. 26, 2019, the content of which is hereby incorporated by reference into this application.

BACKGROUND

1. Field

This relates to an optical module.

2. Description of the Related Art

An optical module is often used in optical transmission equipment for providing function of high-speed conversion between optical signals and electric signals. The optical module is equipped with an optical subassembly with a laser diode and a photodiode, and a printed circuit board (PCB) for control. For electrical connection between the optical subassembly and the PCB, a flexible printed circuit board may be used. The flexible printed circuit board and the PCB are opposed to each other, and their terminals (connection pads) are connected with solder or brazing filler.

Recently, the optical module is sophisticated and downsized to support for multiple channels, whereby narrower pitches between connection pads are becoming more and more common. To prevent the connection pads from short circuit by the solder or the brazing filler, an insulator (solder resist) is interposed between the connection pads. For example, JP H6-53643A discloses that the solder resist partially overlaps with the connection pad; JP H7-283520A discloses that the solder resist overlaps with no connection pad.

Due to being interposed between the two substrates, the solder or the brazing filler for connecting the substrates cannot move in a longitudinal direction between the two substrates and tends to spread laterally. Thus, compared to mounting ICs, there is a greater concern about short circuit between the connection pads. Simply widening a space between the connection pads can prevent the short circuit itself but cannot meet a requirement for a narrower pitch.

Assuming that the structure (JP H6-53643A), where the solder resist partially overlaps with the connection pad, is applied to both the PCB and the flexible printed circuit board, the solder resist is widely disposed, thereby preventing the short circuit and meeting the requirement for the narrower pitch. However, due to a part of the connection pad being covered with the solder resist, a bonding area for the solder or the brazing filler is made narrower, and an impedance mismatch affects high frequency characteristics.

SUMMARY

This aims at suppressing an impact on the high frequency characteristics and preventing the short circuit.

(1) An optical module includes: an optical subassembly for converting optical signal and electric signal at least from one to another; a first substrate with a first surface, the first substrate having some first pads on the first surface; a second substrate with a second surface, the second substrate having some second pads on the second surface, each of the first pads and a corresponding one of the second pads being opposed to each other and constituting an opposed pair of pads; solder or brazing filler for bonding the opposed pair of pads; a first insulation wall between the first surface and the second surface, between an adjacent pair of the first pads, and in contact with the first surface of the first substrate; and a second insulation wall between the first surface and the second surface, between an adjacent pair of the second pads, and in contact with the second surface of the second substrate. The first insulation wall and the second insulation wall overlap with none of the opposed pair of pads and are adjacent to each other in a direction along the first surface and the second surface.

Thus, the first insulation wall and the second insulation wall prevent short circuit. Each of the first insulation wall and the second insulation wall overlaps with none of the opposed pair of pads, leading to no mismatch of impedance, minimizing impact on high frequency characteristics.

(2) In the optical module according to (1), the first insulation wall may be in contact with the second surface of the second substrate, and the second insulation wall may be in contact with the first surface of the first substrate.

(3) In the optical module according to (1), the first insulation wall may be in no contact with the second surface of the second substrate, and the second insulation wall may be in no contact with the first surface of the first substrate.

(4) In the optical module according to any one of (1) to (3), the first insulation wall and the second insulation wall may be in contact with each other.

(5) In the optical module according to any one of (1) to (3), the first insulation wall and the second insulation wall may be in no contact with each other.

(6) In the optical module according to any one of (1) to (5), the first insulation wall may be adjacent to the whole solder or the whole brazing filler in a direction of the adjacent pair of the first pads, and the second insulation wall may be adjacent to the whole solder or the whole brazing filler in a direction of the adjacent pair of the second pads.

(7) In the optical module according to any one of (1) to (6), the first insulation wall and the second insulation wall may be made from solder resist.

DETAILED DESCRIPTION

Hereinafter, some embodiments will be described specifically and in detail with reference to drawings. In all the drawings, the members with the same reference numerals have the identical or same feature and their repetitive description will be omitted. Sizes of figures do not always comply with magnification.

First Embodiment

Figure 1:
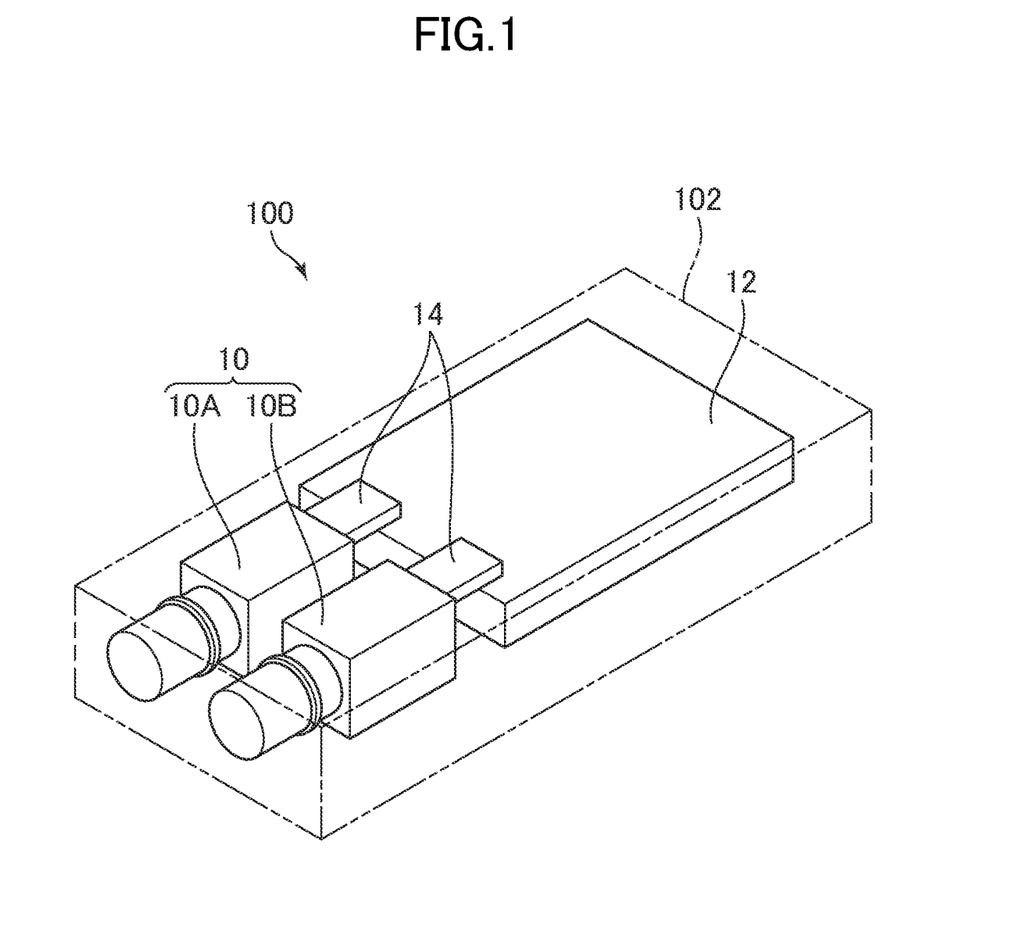
FIG. 1 is a perspective view of an optical module in a first embodiment.

FIG. 1 is a perspective view of an optical module in a first embodiment. An optical module 100 is an optical transceiver with optical transmitting function and optical receiving function, and is adapted for QSFP-DD (quad small form factor pluggable double density) standard; its transmission rate is 400 Gbit/s although another standard or another transmission rate is applicable. The optical module 100 has a module case 102 (housing), an optical subassembly 10, a first substrate 12, and a second substrate 14.

The optical subassembly 10 is a box type with a bottom for a heat dissipation surface and configured to convert an optical signal and an electric signal at least from one to another. The optical subassembly 10 may be at least one of a transmitter optical subassembly 10A and a receiver optical subassembly 10B. The optical subassembly 10 stores some semiconductor elements (oscillators such as laser diodes for transmission, light-receiving elements such as photodiodes for reception) for supporting multiple channels.

A first substrate 12 and a second substrate 14 are connected to each other. The optical subassembly 10 and the first substrate 12 are connected through a second substrate 14. The electric signal is transmitted from the first substrate 12 through the second substrate 14 to the transmitter optical subassembly 10A. The electric signal is transmitted from the receiver optical subassembly 10B through the second substrate 14 to the first substrate 12.

Figure 2:
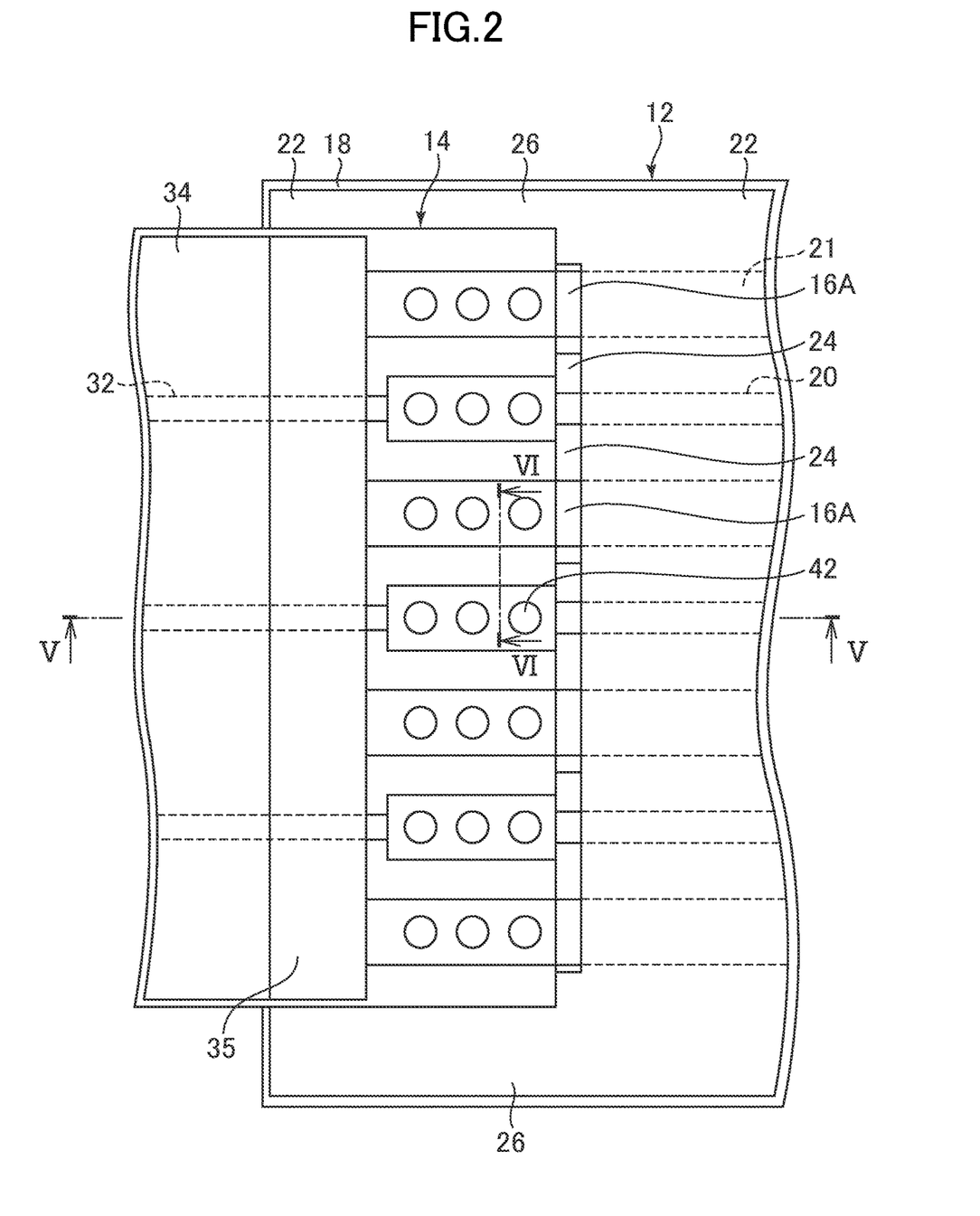
FIG. 2 is a detailed plan view of connection structure of a first substrate and a second substrate.
Figure 3:
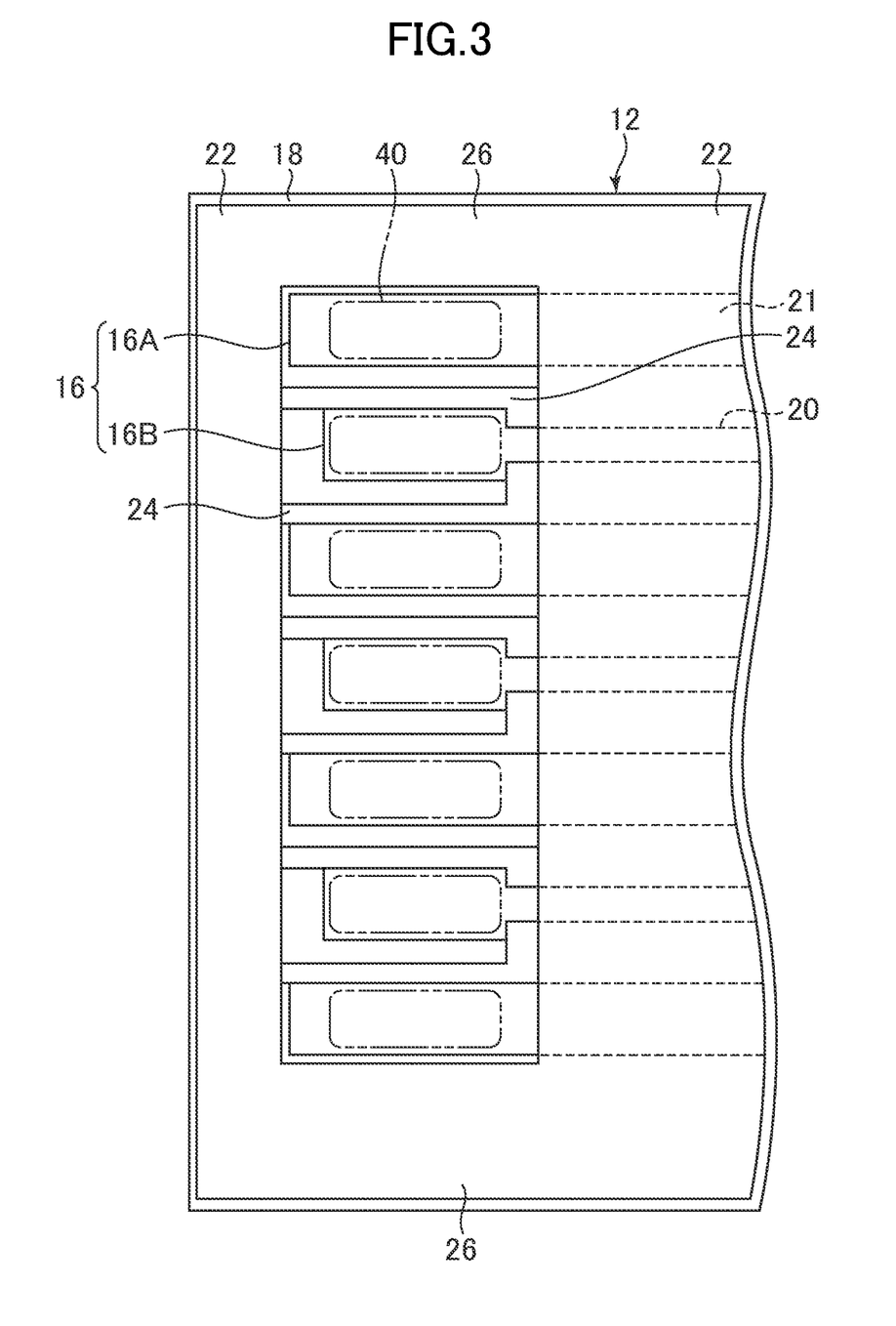
FIG. 3 is a detailed plan view of the first substrate.

FIG. 2 is a detailed plan view of connection structure of the first substrate 12 and the second substrate 14. FIG. 3 is a detailed plan view of the first substrate 12.

The first substrate 12 may be a rigid substrate such as a printed circuit board (PCB). The first substrate 12 is equipped with first pads 16 on a first surface 18. The first pads 16 include first ground pads 16A and first signal pads 16B. The first ground pad 16A is electrically connected to a grand line 21. The first signal pad 16B is connected to a first signal line 20. The first signal line 20 and the grand line 21 are protected by being covered with a first insulation layer 22. Each first pad 16 has at least a part exposed from the first insulation layer 22.

There is a first insulation wall 24 between an adjacent pair of the first pads 16. The first insulation wall 24 is in contact with the first surface 18 of the first substrate 12. The first insulation wall 24 is formed from solder resist. The first insulation wall 24 is a part of the first insulation layer 22, and there is also a first insulation layer 26 outside the outermost one of the first pads 16.

Figure 4:
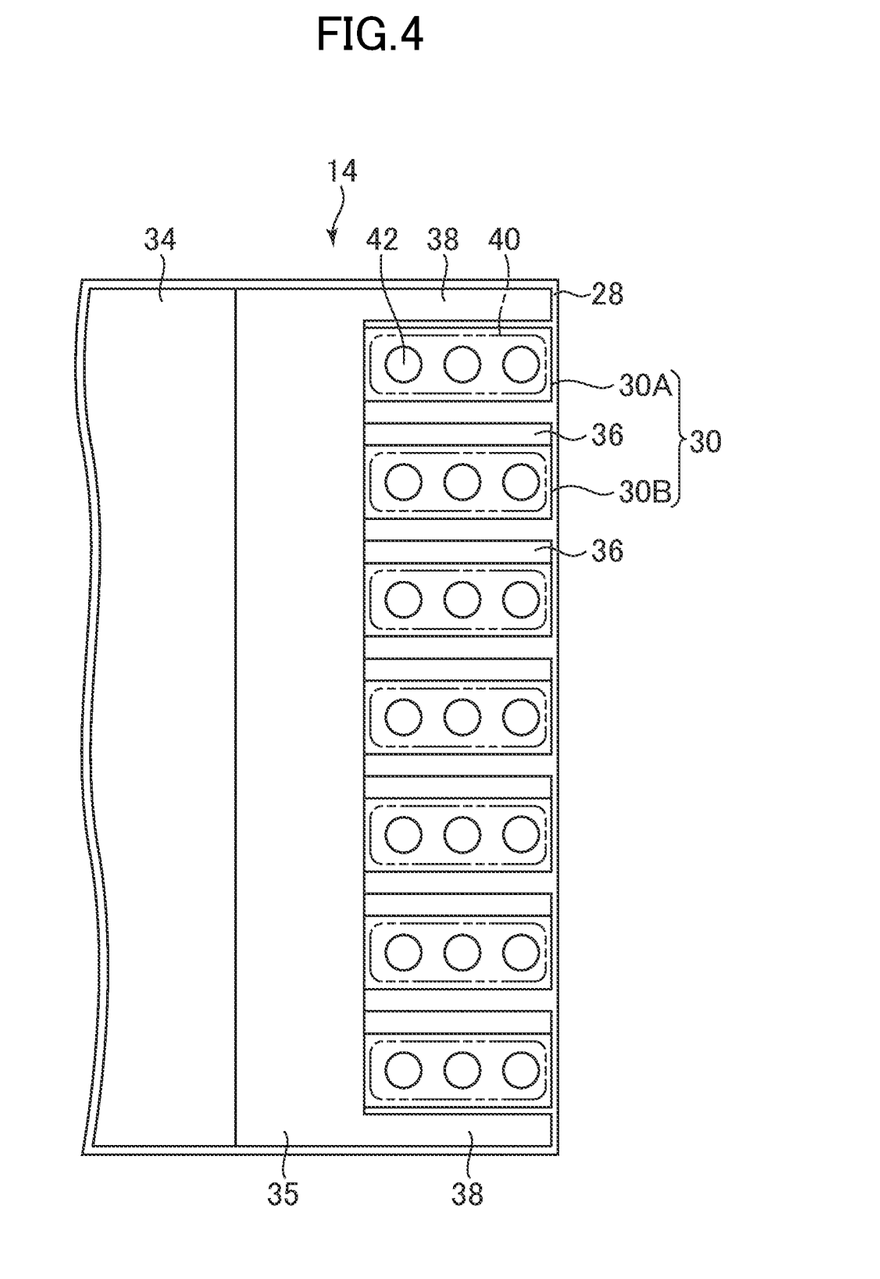
FIG. 4 is a detailed plan view of a back of the second substrate.

FIG. 4 is a detailed plan view of a back of the second substrate 14. The second substrate 14 may be a flexible printed circuit board. The second substrate 14 is connected to a feedthrough (not shown) attached to the optical subassembly 10. The second substrate 14 has a second surface 28. The second surface 28 is a surface (back) opposite to the surface in FIG. 2. The second substrate 14 is equipped with second pads 30 on the second surface 28. The second pads 30 include a second ground pad 30A electrically connected to a ground plane (not shown) on the second surface 28 and a second signal pad 30B connected to a second signal line 32 on the surface in FIG. 2. The unillustrated ground plane and the second signal line 32 are protected by being covered with a second insulation layer 35 and a second cover layer 34.

There is a second insulation wall 36 between an adjacent pair of the second pads 30. The second insulation wall 36 is in contact with the second surface 28 of the second substrate 14. The second insulation wall 36 is formed from solder resist. The second insulation wall 36 is a part of the second insulation layer 35, and there is a second insulation layer 38 outside the outermost one of the second pads 30.

Figure 5:
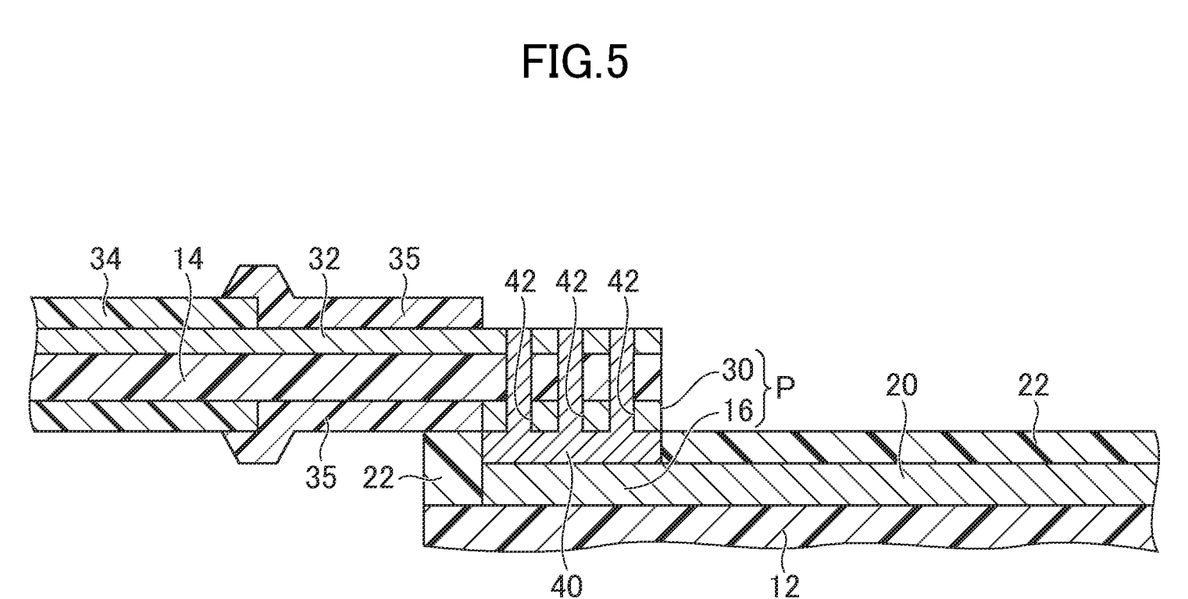
FIG. 5 is a V-V line cross-sectional view of the connection structure in FIG. 2.
Figure 6:
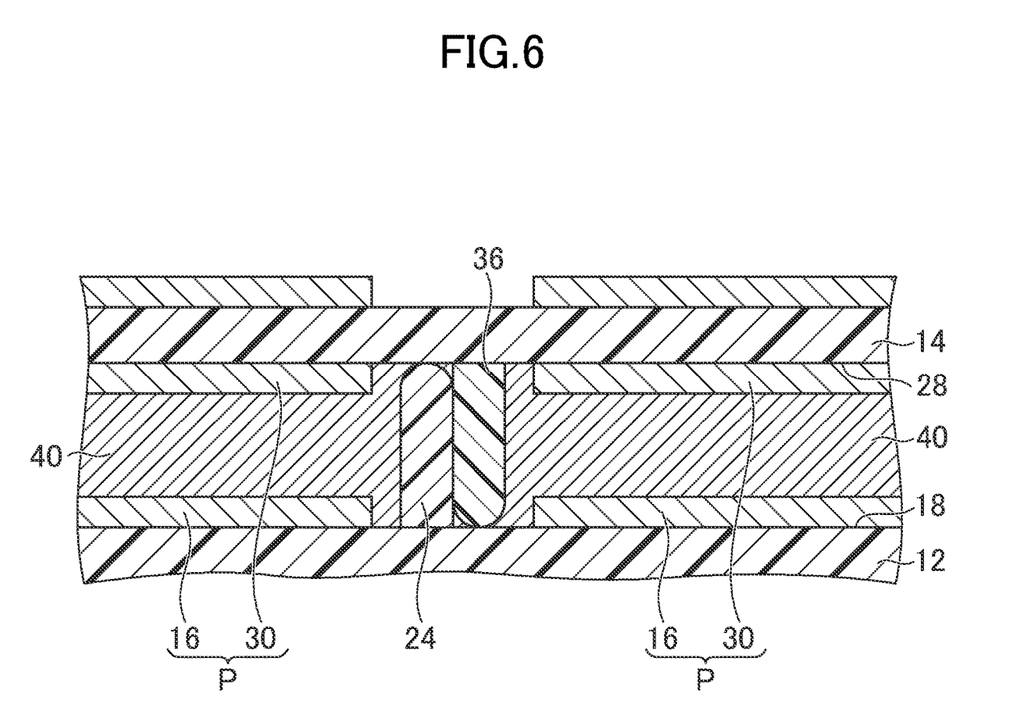
FIG. 6 is a VI-VI line cross-sectional view of the connection structure in FIG. 2.

FIG. 5 is a V-V line cross-sectional view of the connection structure in FIG. 2. FIG. 6 is a VI-VI line cross-sectional view of the connection structure in FIG. 2.

Each first pad 16 and a corresponding one of the second pads 30 constitute a pair of pads P, which are opposed to each other. The opposed pair of pads P are electrically connected by being bonded with solder 40 or brazing filler. The second pad 30 has a via hole 42. The via hole 42 penetrates the second substrate 14, enabling the solder 40 or brazing filler to melt and flow from the surface (FIG. 2) of the second substrate 14 in a direction toward the second surface 28. Thus, the solder 40 or brazing filler is provided between the pair of pads P.

The first insulation wall 24 and the second insulation wall 36 intervene between the first surface 18 and the second surface 28. The first insulation wall 24 is in contact with the second surface 28 of the second substrate 14. The second insulation wall 36 is in contact with the first surface 18 of the first substrate 12. The first insulation wall 24 and the second insulation wall 36 should be of the same height or may be different in height as long as they are higher than the first pad 16 or the second pad 30.

The first insulation wall 24 and the second insulation wall 36 overlap with none of the opposed pair of pads P. Thus, a bonding area for the solder 40 or brazing filler is not made smaller on the first pad 16 or the second pad 30, leading to no deterioration of high frequency characteristics due to mismatch of impedance.

The first insulation wall 24 and the second insulation wall 36 are adjacent to and in contact with each other in a direction along the first surface 18 and the second surface 28. This is a result of having aligned the first substrate 12 and the second substrate 14 by abutting the first insulation wall 24 and the second insulation wall 36 on their sides. In spite of manufacturing variation and connection misalignment of the first insulation wall 24 and the second insulation wall 36, walls can be surely made between adjacent first pads 16 and between adjacent second pads 30.

The first insulation wall 24 is next to the whole solder 40 or brazing filler in a direction of adjacent first pads 16. The second insulation wall 36 is next to the whole solder 40 or brazing filler in a direction of adjacent second pads 30. Thus, the effect of preventing the short circuit due to the flow of solder 40 or brazing filler can be reliably obtained.

Instead of the combination of the first substrate 12 and the second substrate 14, a rigid substrate and a rigid substrate or a flexible printed circuit board and a flexible printed circuit board can be employed. Or, the feedthrough (ceramic circuit board) attached to the optical subassembly may be the second substrate.

Second Embodiment

Figure 7:
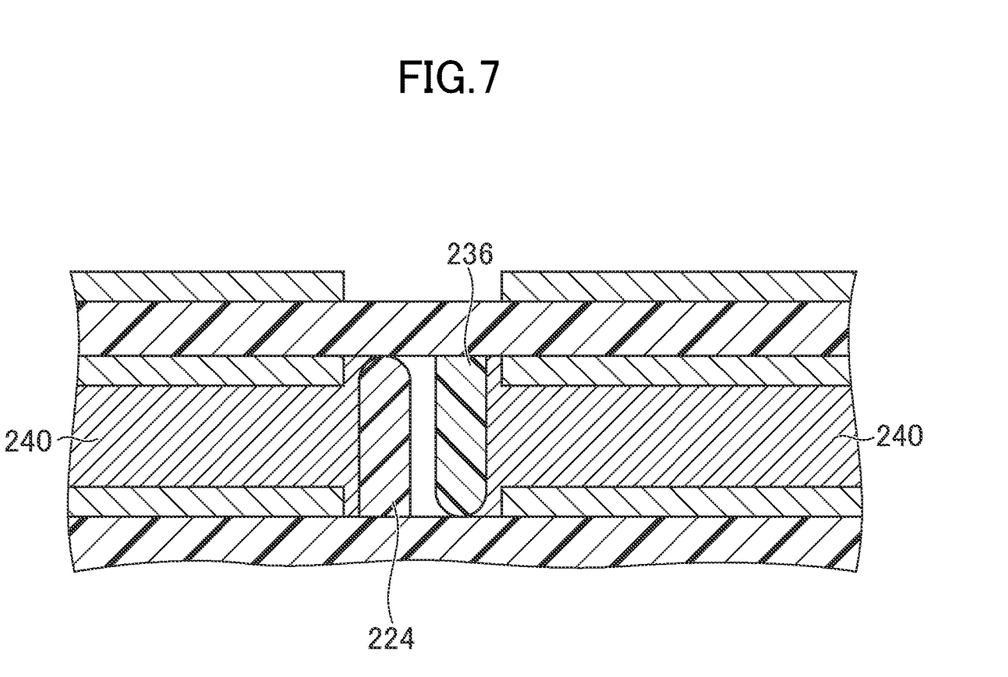
FIG. 7 is a cross-sectional view of connection structure of a first substrate and a second substrate in a second embodiment.

FIG. 7 is a cross-sectional view of connection structure of a first substrate and a second substrate in a second embodiment. In the embodiment, the first insulation wall 224 and the second insulation wall 236 are in no contact with each other, nevertheless a double wall is formed, ensuring the effect of preventing the short circuit due to the flow of the solder 240 or the brazing filler while it melts.

Third Embodiment

Figure 8:
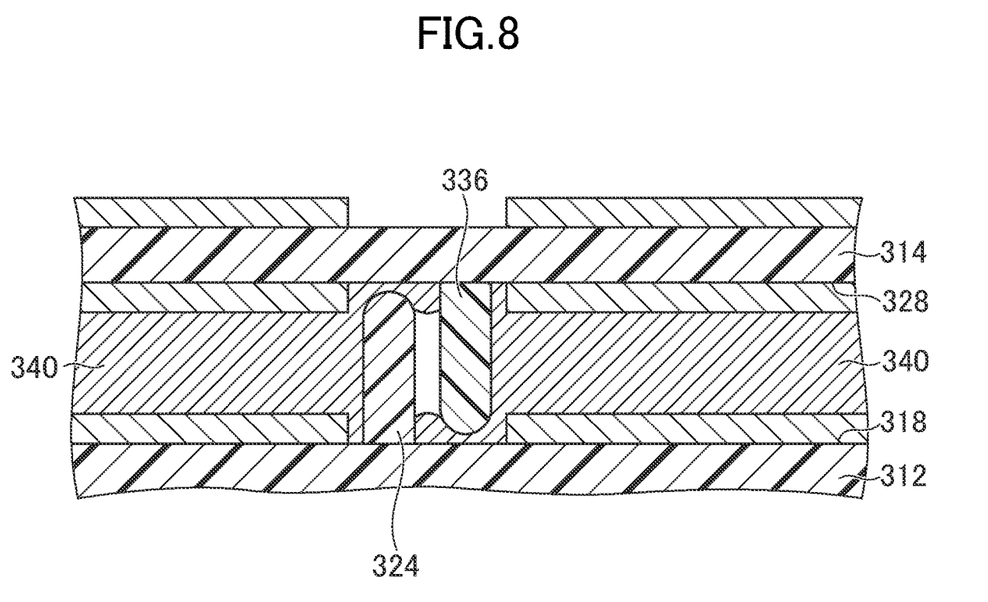
FIG. 8 is a cross-sectional view of connection structure of a first substrate and a second substrate in a third embodiment.

FIG. 8 is a cross-sectional view of connection structure of a first substrate and a second substrate in a third embodiment. In the embodiment, the first insulation wall 324 is in no contact with the second surface 328 of the second substrate 314. The second insulation wall 336 is in no contact with the first surface 318 of the first substrate 312. The first insulation wall 324 and the second insulation wall 336 are in no contact with each other.

In this embodiment, because the double wall can lengthen a path for the molten solder 340 or the molten brazing filler to flow, and also owing to viscous nature of the molten solder 340 or the molten brazing filler, the short circuit can be prevented reliably.

While there have been described what are at present considered to be certain embodiments, it will be understood that various modifications may be made thereto, and it is intended that the appended claims cover all such modifications as fall within the true spirit and scope of the invention.

What is claimed is:

1. An optical module comprising:
an optical subassembly for converting optical signal and electric signal at least from one to another;
a first substrate with a first surface, the first substrate having some first pads on the first surface;
a second substrate with a second surface, the second substrate having some second pads on the second surface, each of the first pads and a corresponding one of the second pads being opposed to each other and constituting an opposed pair of pads;
solder or brazing filler for bonding the opposed pair of pads;
a first insulation wall between the first surface and the second surface, between an adjacent pair of the first pads, and in contact with the first surface of the first substrate; and
a second insulation wall between the first surface and the second surface, between an adjacent pair of the second pads, and in contact with the second surface of the second substrate,
wherein the first insulation wall and the second insulation wall overlap with none of the opposed pair of pads and are adjacent to each other in a direction along the first surface and the second surface.

2. The optical module according to claim 1, wherein
the first insulation wall is in contact with the second surface of the second substrate, and
the second insulation wall is in contact with the first surface of the first substrate.

3. The optical module according to claim 1, wherein
the first insulation wall is in no contact with the second surface of the second substrate, and
the second insulation wall is in no contact with the first surface of the first substrate.

4. The optical module according to claim 1, wherein the first insulation wall and the second insulation wall are in contact with each other.

5. The optical module according to claim 1, wherein the first insulation wall and the second insulation wall are in no contact with each other.

6. The optical module according to claim 1, wherein
the first insulation wall is adjacent to the whole solder or the whole brazing filler in a direction of the adjacent pair of the first pads, and
the second insulation wall is adjacent to the whole solder or the whole brazing filler in a direction of the adjacent pair of the second pads.

7. The optical module according to claim 1, wherein the first insulation wall and the second insulation wall are made from solder resist.

* * * * *